(12) United States Patent
Ancora et al.

(10) Patent No.: US 8,705,665 B2
(45) Date of Patent: Apr. 22, 2014

(54) PROCESS FOR PERFORMING LOG-LIKELIHOOD-RATIO CLIPPING IN A SOFT-DECISION NEAR-ML DETECTOR, AND DETECTOR FOR DOING THE SAME

(75) Inventors: Andrea Ancora, Nice (FR); Sebastien Aubert, Nice (FR)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/578,793

(22) PCT Filed: Feb. 14, 2011

(86) PCT No.: PCT/EP2011/000682
§ 371 (c)(1),
(2), (4) Date: Oct. 11, 2012

(87) PCT Pub. No.: WO2011/098297
PCT Pub. Date: Aug. 18, 2011

(65) Prior Publication Data
US 2013/0107989 A1 May 2, 2013

(30) Foreign Application Priority Data

Feb. 15, 2010 (EP) .................................... 10368015

(51) Int. Cl.
*H03D 3/22* (2006.01)
(52) U.S. Cl.
USPC ........ 375/332; 369/59.22; 375/262; 375/341; 714/794
(58) Field of Classification Search
None
See application file for complete search history.

(56) References Cited

U.S. PATENT DOCUMENTS

2009/0304116 A1* 12/2009 Challa et al. .................. 375/340

OTHER PUBLICATIONS

David L. Milliner et al.; "Channel State Information Based LLR Clipping in List MIMO Detection", Personal, Indoor and Mobile Radio Communications, 2008. PIMRC 2008. IEEE 19th International Symposium on IEEE, Piscataway, NJ, USA Sep. 15, 2008; pp. 1-5, XP031371640, ISBN: 978-1-4244-2643-0.
Lei Xiao et al.; "A New Approach to Calculating the Exact Transition Probability and Bit Error Probability of Arbitrary Two-Dimensional Signaling", Global Telecommunications Conference, 2004. Globecom 2004. IEEE Dallas, TX, USA; Nov. 29-Dec. 3, 2004, Piscataway, NJ, USA, LNKD-DOI:10.1109/Glocom. 2004. 1378154 vol. 2, Nov. 29, 2004; pp. 1239-1243, XP010757714, ISB: 978-0-7803-8794-2, p. 1239-1243, XP010757714, ISBN 978-0-7802, Section III "The Transition Probability for Arbitrary 2-D Signalling".

* cited by examiner

*Primary Examiner* — Adolf Dsouza
(74) *Attorney, Agent, or Firm* — Coats and Bennett PLLC

(57) ABSTRACT

A process for computing Log-Likelihood-ratios (LLRs) in a detector of a wireless communication receiver is disclosed, with the, LLRs being used by a channel decoder. A signal is received from a telecom front end, the signal corresponding to data belonging to a finite set of constellation symbols, each constellation symbol being arranged in a lattice constellation impaired by additive noise and a multiplicative channel. A limited set of distances representative of Euclidian distances between the received signal and a finite set of predetermined constellation symbols are computed, possibly multiplied by the channel. A set of soft decision LLRs are derived from the computed set of distances under the constraint of a limited length of the list of distances. The derived LLRs are completed by clipping values read from a look-up table which is simultaneously addressed by the values of the SNR and a bit index.

15 Claims, 10 Drawing Sheets

PROCESS FOR PERFORMING LOG-LIKELIHOOD-RATIO CLIPPING IN A SOFT-DECISION NEAR-ML DETECTOR, AND DETECTOR FOR DOING THE SAME

TECHNICAL FIELD

The invention relates to the field of wireless communications and more to particularly to a process for performing LLR computations in a soft-decision near-Maximum Likelihood detector, and a receiver for doing the same.

BACKGROUND ART

Nowadays, wireless communications have become increasingly popular and wireless networks show a continuous increasing transmission capacity with the general use of more powerful modulation techniques, such as M-ary Quadrature Amplitude Modulation (QAM).

QAM provides a constellation of a M number of modulation values (each having a different combination of phase and amplitude), wherein each constellation point (symbol) represents a plurality of information bits. The number of bits that are represented by each symbol in a M-ary QAM system is equal to $\log_2 M$. Different M-ary QAM constellations are widely spread, from the robust 4QAM, to the high rate 64QAM constellation.

QAM technique can be advantageously combined with more recent schemes such as the Orthogonal Frequency Division Multiplex (OFDM) as well as the Multiple In Multiple Out (MIMO) techniques.

In a MIMO system, comprising M transmit antennas and N receive antennas, the receiver has to process a set of M transmitted symbols (for instance in OFDM) from a set of N observed signals, which signals might be corrupted by the non-ideal characteristics of the channel and noise. The detector's role is to choose one s among all possible transmitted symbol vectors based on the received data, and the estimated channel. As known by the skilled man, the detector which always return the optimal solution is the so-called Maximum Likelihood (ML) detector, the implementation of which shows to be of prohibitive complexity.

However, such optimal Maximum Likelihood detector can be efficiently approximated by the use of several techniques such as Sphere Decoding, Lattice Reduction or a combination of both, often referred as soft-decision near-ML techniques. The soft-decision near-ML provides exact Log-Likelihood-Ratio (LLR) computation for most of the bits constituting the channel and MIMO encoded is transmitted sequence.

Generally speaking, as basically illustrated in FIG. 1, the near-ML detector generates a list of distances for a given bit to be used in a second step for the computation of the LLR.

In the case of max-log approximation, the above mentioned list of distances is approximated by only two distances computed between the point of the received demodulated symbol and a hypothetic constellation symbol having respective bit values of 1 and 0.

The LLR estimate for a $k^{-th}$ bit can be computed in accordance with the following formula, well known to a skilled man:

$$LLR_k = 1/\sigma^2 * (d^2_{1min,k} - d^2_{0min,k})$$

with $d^2_{1min,k}$ being the minimum distance between the received demodulated symbol and a QAM constellation point where that particular bit equals one and $d^2_{0min,k}$ being the minimum distance between the received demodulated symbol and a QAM constellation point where that particular bit equals zero. Also, $\sigma^2$ denotes the noise variance.

In order to reduce its complexity (with respect to the ML detector), the near-ML detector performs the computation of the LLR only for a limited number of bits belonging to the sequence.

For other bits belonging to the sequence, the LLR is not explicitly calculated and it is generally set to a predefined value. This operation is commonly referred as LLR clipping, as addressed in the following two references:

[1] B. M. Hochwald and S. ten Brink. "Achieving near-capacity on a multiple-antenna channel". Communications, IEEE Transactions on, vol. 51, p. 389-399, March 2003.

[2] Y. de Jong and T. Willink, "Iterative Tree Search Detection for MIMO wireless systems", Communications, IEEE Transactions on, vol. 53, p. 930-935, June 2005.

However, the choice of the clipping level has a strong impact on the system performance.

Generally speaking, if the chosen clipping level is too high, this prevents the correction of decision errors occurring at some bit positions, resulting in poor performance. Conversely, if the chosen clipping level is too low, this limits the mutual information at the detector output and also leads to decreased performance.

The article "Channel State Information Based LLR Clipping in List MIMO Detection" by David L. Milliner et. al., School of Electrical and Computer Engineering, Georgia Institute of Technology, Atlanta, Ga. 30332-0250 discloses an improved mechanism which uses clipping levels based on the knowledge of the SNR (Signal to Noise Ratio). These results are compared to the [2] reference that uses Fixed LLR Clipping Levels (FLC) set to +3 and −3 according to the bit sign. Although this prior art has been shown to be a significant improvement with respect to the FLC, such technique relies on the presence of a Gaussian signal which does not correspond to the reality of the discrete QAM constellation.

There is therefore a wish for a more appropriate mechanism.

SUMMARY OF THE INVENTION

It is an object of the invention to provide a new process for computing the LLR in coded MIMO systems which takes into account the multi-level bit mapping nature of Quadrature Amplitude Modulation.

It is an object of the present invention to provide an enhanced process for computing the LLR in coded MIMO systems in order to provide near-optimal bit-wise detection performances with limited increase of the complexity.

It is still another object of the invention to provide a process for computing the Log-Likelihood-Ratios in a MIMO soft-decision near-ML detector.

It is a further object of the invention to provide a Sphere Decoder near-ML which is designed in order to generate LLR by applying clipping values with the knowledge of the bit position and of the SNR.

These and other objects of the invention are achieved by means of a process for computing soft-decision values or Log-likelihood-ratios (LLR) in a detector of a wireless communication receiver, which includes the steps of:

—receiving a signal from a telecom front end, said signal corresponding to data belonging to a finite set of constellation symbols, each constellation symbol being arranged in a lattice constellation impaired by an additive noise and also by a multiplicative channel;

computing a limited set of distances representative of the Euclidian distances between the received signal and a finite set of predetermined constellation symbols, possibly multiplied by the channel;

deriving a set of soft decisions or Log Likelihood Ratios (LLR) from said computed set of distances under the constraint of a limited length of the list of distances, and completing said derived LLR by clipping values read from a look-up table which is simultaneously addressed by the values of the SNR and the bit index, for distances not included within said limited list of distances.

In one embodiment, there is a predetermined length of a limited list of distances for which an accurate LLR will be computed by the detector. Then, a predetermined set of distances are computed in accordance with said length.

The process then proceeds with the computation of the LLRs for the predetermined set of distances and then complete such calculation by the reading of a look-up table which is simultaneously addressed by the values of the SNR and the bit index, and possibly the index value.

In one embodiment the constellation is a quadrature Amplitude Constellation, such as a 4QAM, 16QAM or 64QAM. The Channel decoder may be a turbo decoder or a Viterbi decoder.

The invention also achieves a receiver for a wireless communication system including a detector which comprises:

means for receiving a signal from a telecom front end, said signal corresponding to data belonging to a finite set of constellation symbols, each constellation symbol being arranged in a lattice constellation impaired by an additive noise and also by a multiplicative channel;

means for computing a limited set of distances representative of the Euclidian distances between the received signal and a finite set of predetermined constellation symbols, possibly multiplied by the channel;

means for deriving a set of soft decisions or Log Likelihood Ratios (LLR) from said computed set of distances under the constraint of a limited length of the list of distances, and means for completing said derived LLR by clipping values read from a look-up table which is simultaneously addressed by the values of the SNR and the bit index, for distances not included within said limited list of distances.

The invention is particularly adapted for embodying a soft-decision near-ML detector which can be used for a MIMO wireless communication system.

DESCRIPTION OF THE DRAWINGS

Other features of one or more embodiments of the invention will be best understood by reference to the following detailed description when read in conjunction with the accompanying drawings.

DESCRIPTION OF THE PREFERRED EMBODIMENT

There will now be described a process which enhances the LLR computation by means of an improved clipping selection mechanism.

The invention is particularly suitable for a MIMO soft-decision near-ML detector that can be used in an Orthogonal Frequency Division Multiplexing (OFDM).

However, it should be clear that the process and mechanism described below will be applicable to any other kind of modulation.

For the sake of clarity, the example of the 16 Quadrature Amplitude Modulation (QAM) will be considered but, again, the skilled man will straightforwardly apply the principles underlying in the process below to any other type of modulation, such as a 64QAM for instance.

Figure 1:
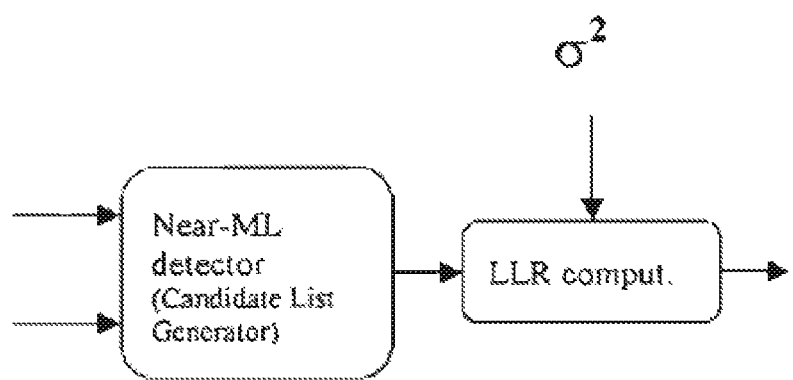
FIG. 1 illustrates a prior art detector providing LLR computation.
Figure 2:
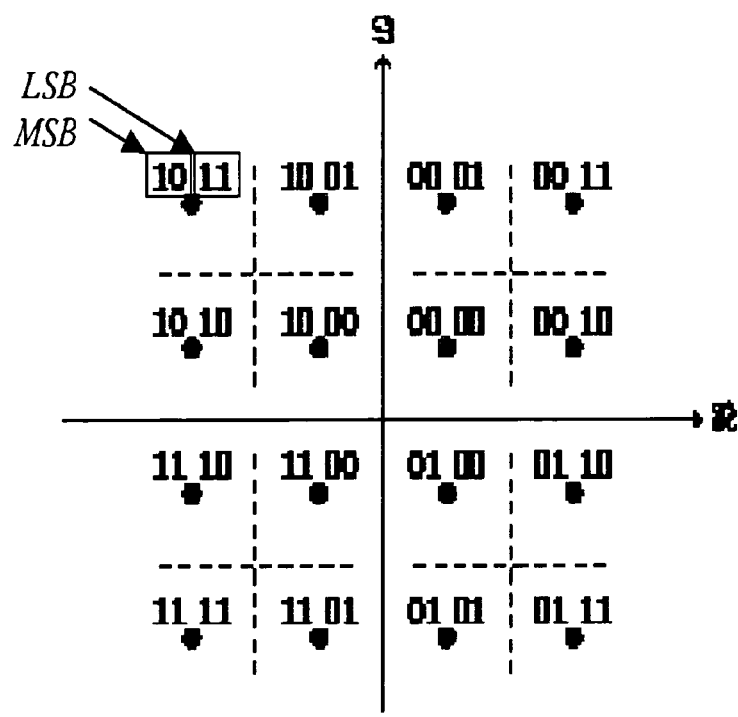
FIG. 2 illustrates the example of 16QAM case showing two levels exist, comprising Most Significant Bits (MSB) and Least Significant Bits (LSB) for each signal point.

As shown in FIG. 2, the 16QAM is based on a constellation plane defined by a horizontal axis representing the real portions and a vertical axis representing the imaginary portions. Accordingly, the constellation plane is divided into four quadrants, each quadrant including four symbols.

Each symbol of the 16QAM system corresponds to $log_2 16$ or four bits, including the Least Significant Bits (LSB) and the Most Significant Bits (MSB) which can be differently distributed in accordance to particularly requirements. FIG. 2 shows one typical mapping configuration between the four bits and the constellation points.

FIG. 2 shows that the different bits composing one symbol show different levels of "protection" or immunity against noise and amplitude impairments. In particularly, the MSB bits are protected by a higher Euclidean distance than the LSB since, in order to mistake one MSB bit, the receiver has to switch from one quadrant to another one among the four quadrants. Conversely, for the LSB, the mistake can occur within a same quadrant.

In the particular case of the 16QAM, one sees that the MSB and the LSB are shared between two groups, each group being associated with one particular level of immunity or protection.

In the case of a 64QAM, the different bits are distributed within three different groups showing three distinctive levels of immunity or protection.

In order to take into account those different levels of immunity between the MSB and the LSB (in the illustrative example of the 16QAM of FIG. 2), there is provided a mechanism for setting the LLRs to be provided to the channel decoder.

Indeed, the invention deviates from the known mechanisms and particularly the conventional Fixed Log-likelihood-ratio Clipping (FLC) mechanism, or even the so-called SNR Log-likelihood-ratio Clipping (SLC) evoked above, by providing a new and effective process which takes into account of the multi-level bit mapping nature of QAM.

Figure 9:
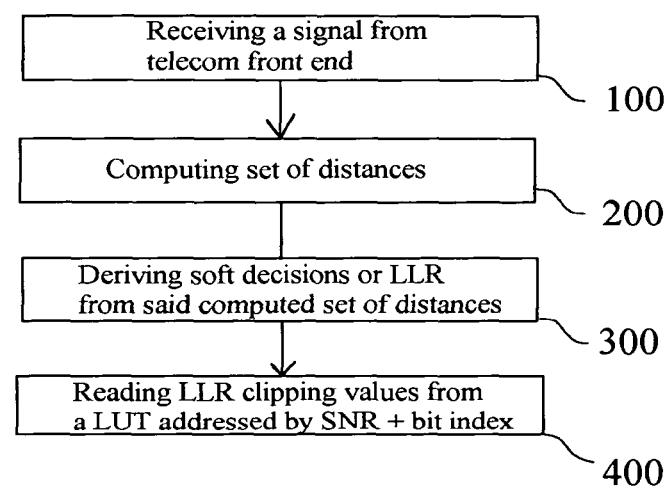
FIG. 9 illustrates the process of the invention.

Such process is illustrated in FIG. 9 which shows the following step used for computing the LLR in a decoder:

receiving (step 100) a signal from a telecom front end, said signal corresponding to data belonging to a finite set of constellation symbols, each constellation symbol being arranged in a lattice constellation impaired by an additive noise and also by a multiplicative channel;

computing (step 200) a set of distances representative of the Euclidian distances between the received signal and a finite set of predetermined constellation symbols, possibly multiplied by the channel;

deriving (step 300) a set of soft decisions or Log Likelihood Ratios (LLR) from said computed set of distances under the constraint of a limited length of the list of distances, and completing (step 400) said derived LLR by clipping values read from a look-up table which is simultaneously addressed by the values of the SNR and the bit index.

More particularly, a particular length is determined which is used for determining a set or limited list of distances for which an accurate LLR will be computed by the detector.

However, for other distances which are not included in the limited list so as to limit the complexity of the process, then a clipping value will be returned which is read from a look-up table which is simultaneously addressed by at least two values: the SNR and the bit index.

In one embodiment, the constellation is a quadrature Amplitude Constellation, such as a 4QAM, 16QAM or 64QAM. The Channel decoder may be a turbo decoder or a Viterbi decoder.

Figure 6:
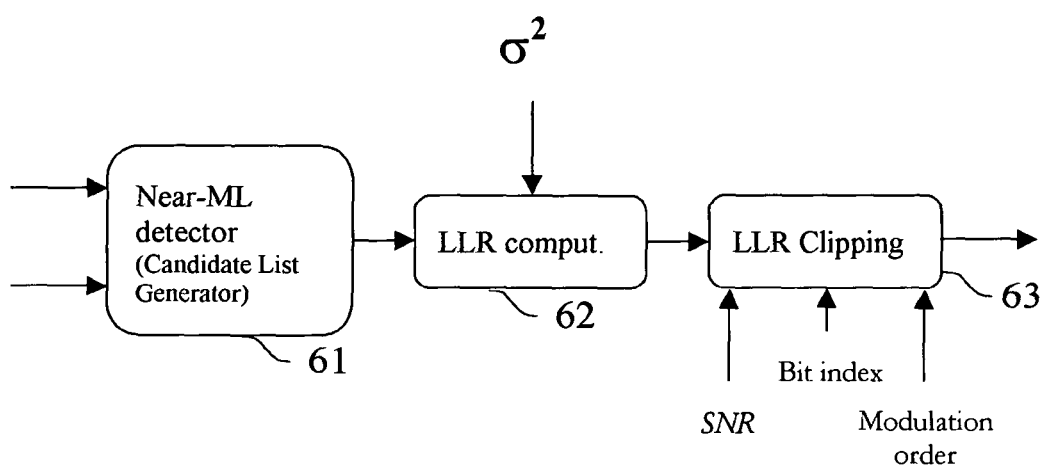
FIG. 6 illustrates a block diagram of one embodiment of a receiver according to the present invention.

In one particular embodiment, the look-up table is addressed by the following three parameters:
the SNR
the bit index
the order of the modulation FIG. 6 illustrates one simplified block-diagram of one embodiment of a soft-decision near-ML detector according to the present invention.

The architecture comprises one near-ML detector 61, for instance a Sphere Decoder (SD) near-ML detector, comprising means for generating a list of distances for a given bit to be used in the second step for the computation of the LLR.

In the case of max-log approximation, the list of candidates is constituted by only two distances computed between the received signal point and the closest symbols signaling both 1 and 0 for the considered bit. The LLR for $k^{-th}$ bit can be computed by mean s of a LLR computation block 62 in accordance with any formula known to the skilled man, such as the conventional formulation of the Max Log approximation, given below:

$$LLR_k = 1/\sigma^2 * (d^2_{1min,k} - d^2_{0min,k})$$

where $\sigma^2$, $d_{1min,k}$ and $d_{0min,k}$ denote the noise variance and the minimal Euclidean distances for the $k^{th}$ transmitted bit being 1 and 0, respectively.

For the particularly occurrences where LLRs are not accurately computed (the detector 61 being assumed to be a near-ML detector and not a ML detector), a LLR clipping block 63 is involved for determining one appropriate LLR clipping level to consider.

In one embodiment, the LLR clipping level is extracted from a look-up table which is addressed by means of the following parameters: the SNR; the bit index; and the order of the modulation.

This mechanism shows to be very advantageous since the difference of sensitivity between the MSB and the LSB is quite important.

Figure 3:
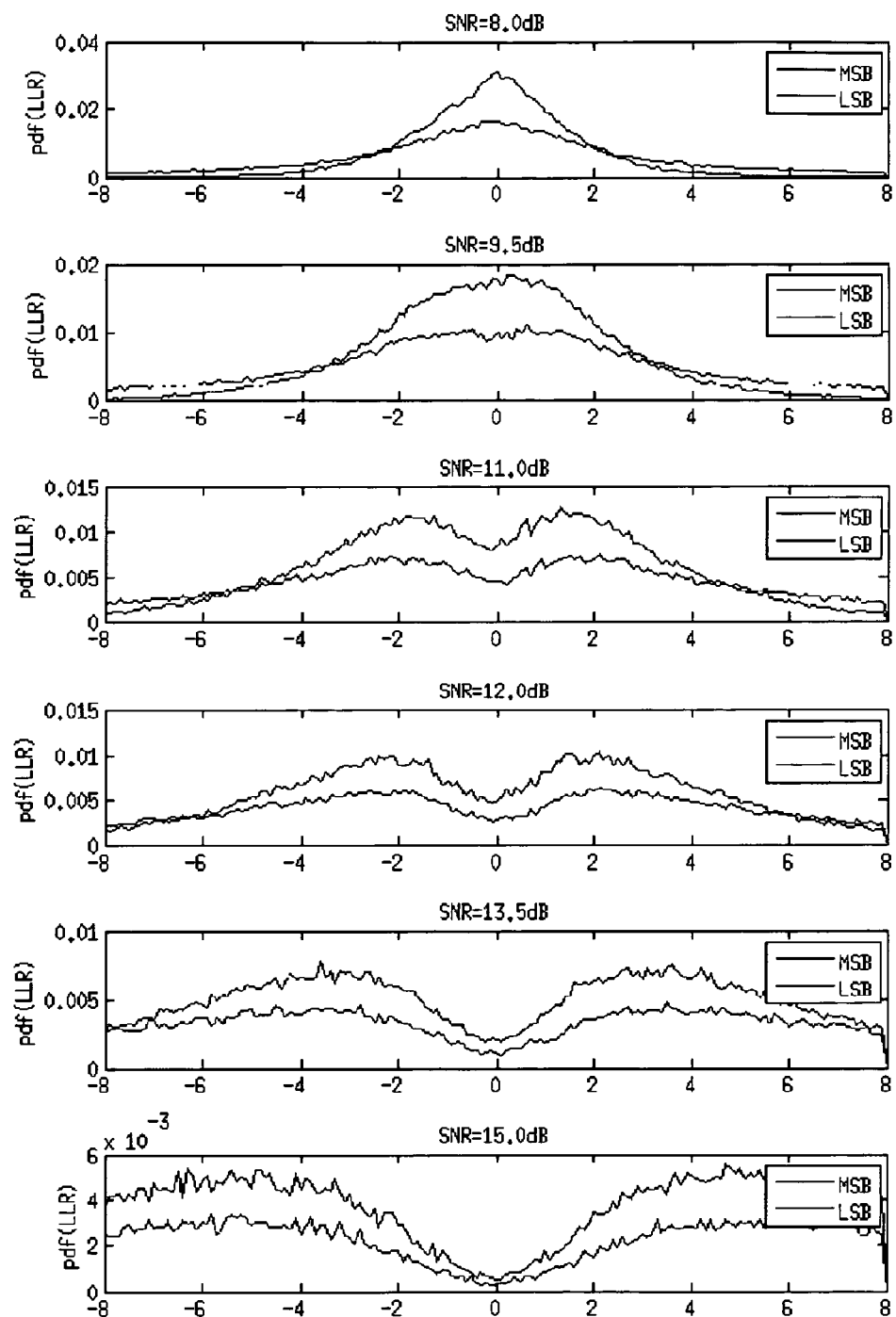
FIG. 3 illustrates the LLR distribution of the perfect ML decoder and shows that LLRs amplitude and distribution depends on the SNR and on the bit level.

FIG. 3 illustrates more particularly the LLR distribution of the perfect ML decoder, for six consecutive values of the SNR: 8 dB, 9.5 dB, 11.0 dB, 12.0 dB, 13.5 dB and 15 dB. The figure clearly shows that the LLRs amplitude and distribution depend on the SNR and also on the bit level.

Figure 4:
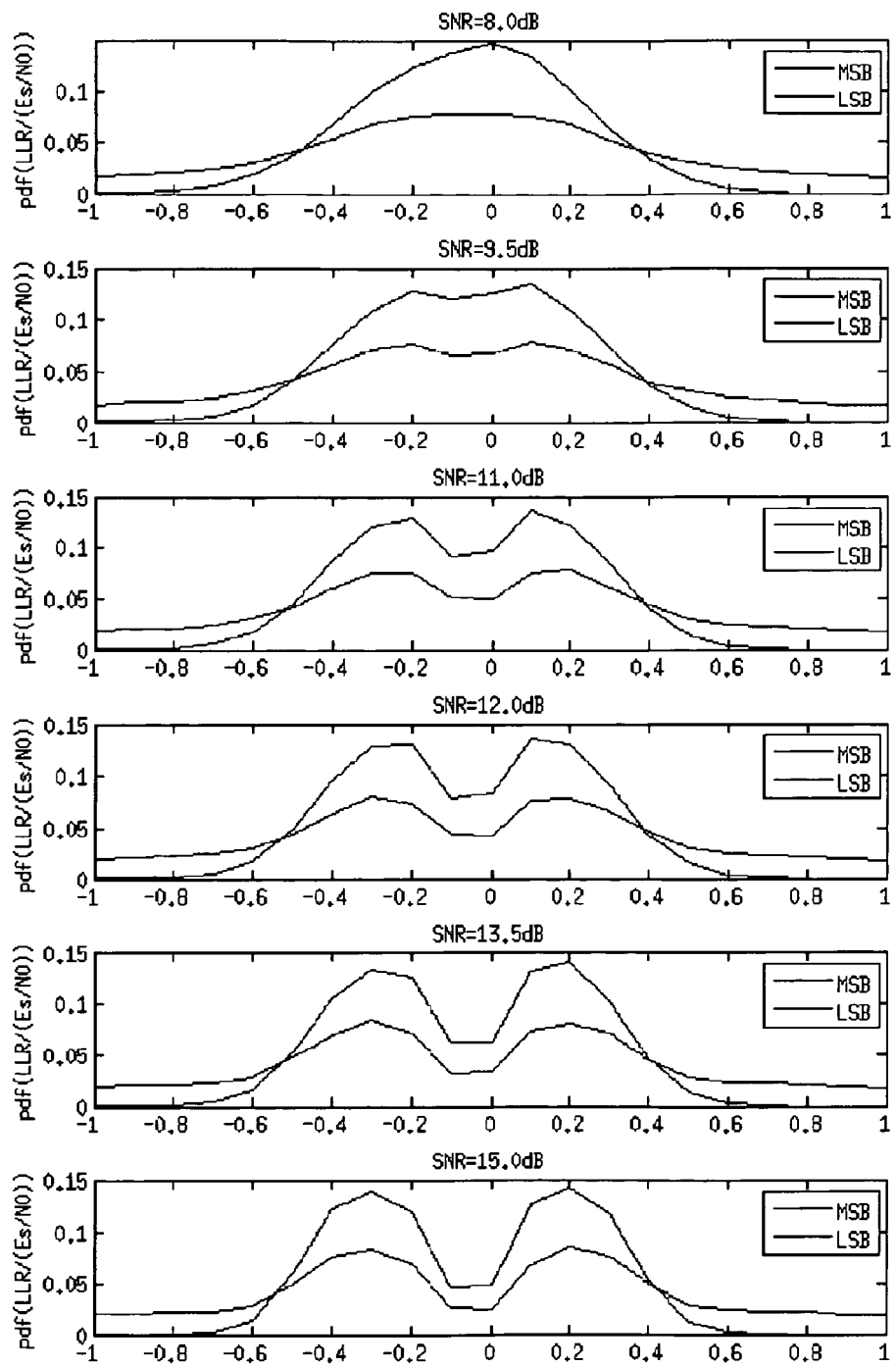
FIG. 4 illustrates the distribution of LLRs normalized by SNR for the described embodiment. It can be further noticed that the LLR distributes differently even within the same bit level depending if there are positive or negative. In the figure, it is clear the positive LLRs for the LSB are upper bounded.

With respect to FIG. 4, there is illustrated the distribution of LLRs, once normalized by the SNR. It can be further noticed that the LLR distributes differently even within the same bit level depending if there are positive or negative. In the figure, it is clear the positive LLRs for the LSB are upper bounded.

Figure 5:
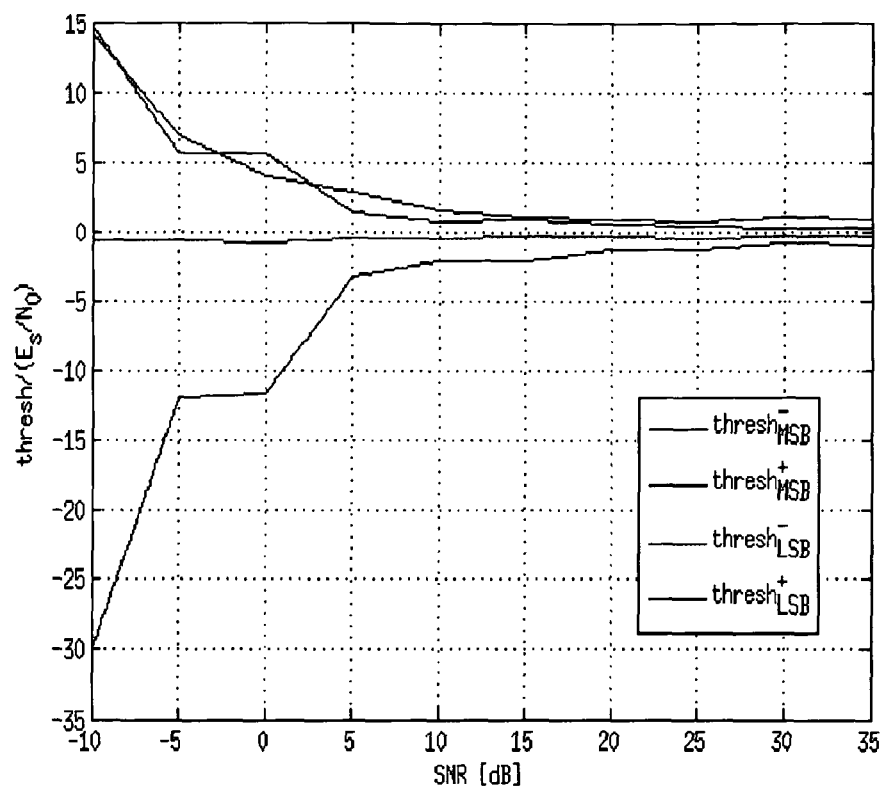
FIG. 5 illustrates the Maximum LLR values as a function of SNR.

Concerning the positive LSB and the MSB, the LLRs still depend on the SNR. This point is more clearly illustrated in FIG. 5, where the maximum LLRs at the SD near-ML output are plotted as a function of SNR for different bit positions: $MSB^-$, $MSB^+$, $LSB^-$ and $LSB^+$.

The positive LLR clipping value for the LSB, denoted as $LClip_{LSB}^+$, is constant over the SNR range, as noticed before. This is different from the case of the negative LLR clipping value for the LSB, denoted as $LClip_{LSB}^-$, and which depends on the SNR and on the number of clipped bits. Consequently, $LClip_{LSB}^- \neq LClip_{LSB}^+$.

The negative and positive LLR Clipping value for the MSB, denoted as $LClip_{MSB}^-$ and $LClip_{MSB}^+$ also depend on the SNR and on the number of clipped values.

As shown by simulation results, the LLR values are distributed differently depending on the bit index and the SNR.

It can therefore be seen that the LLR clipping mechanism can be significantly improved by exploiting this additional knowledge and thus generate approximated LLR with lower distortion.

FIGS. 7a to 7d illustrate the Bit Error Rate (BER) obtained according to three sizes of set of distances with the assumption of a SNR of 10 dB, which corresponds to a BLock Error Rate (BLER) of $10^-$ with the ML detector, as a function of possible clipping values and for all the bit indexes.

For the sake of clarity and simplicity, all the clipping values are chosen separately, but this should be considered as only one illustrative example only.

The simulations results are obtained for different ratios— respectively 38%, 73% and 100%—of clipped LLR. The ratio is the proportion of clipped value from the soft ML outputs. In the case of a ratio of p: p % of the ML LLRs are clipped to the tested value. The 100-p % other LLR values are not modified.

All the simulation results are compared to the ML BER, used as a reference, and to the constant +/−3 clipping value, which is shown to be a very efficient empirical result. See for instance reference [2] above.

If clipping values are considered separately, the BER performance are illustrated in FIGS. 7a to 7d, for $LSB^+$, $LSB^-$, $MSB^+$ and $MSB^-$, respectively.

Figure 7A:
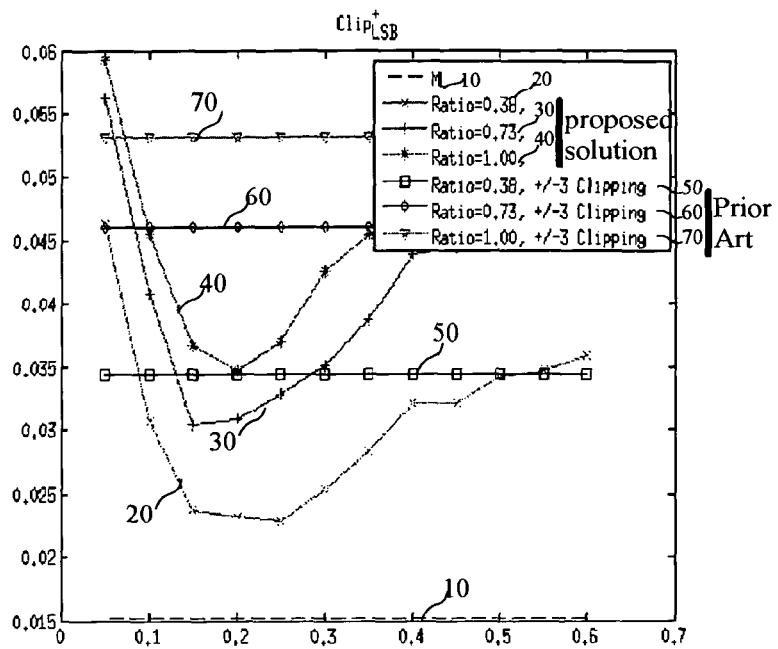
FIGS. 7a-7d illustrate the BER performance for $LSB^+$, $LSB^-$, $MSB^+$ and $MSB^-$, respectively.
Figure 7B:
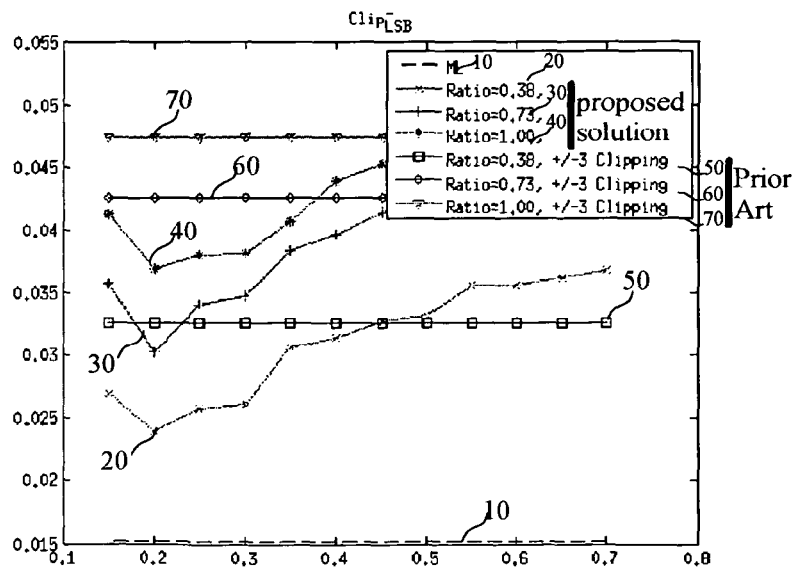
Figure 7C:
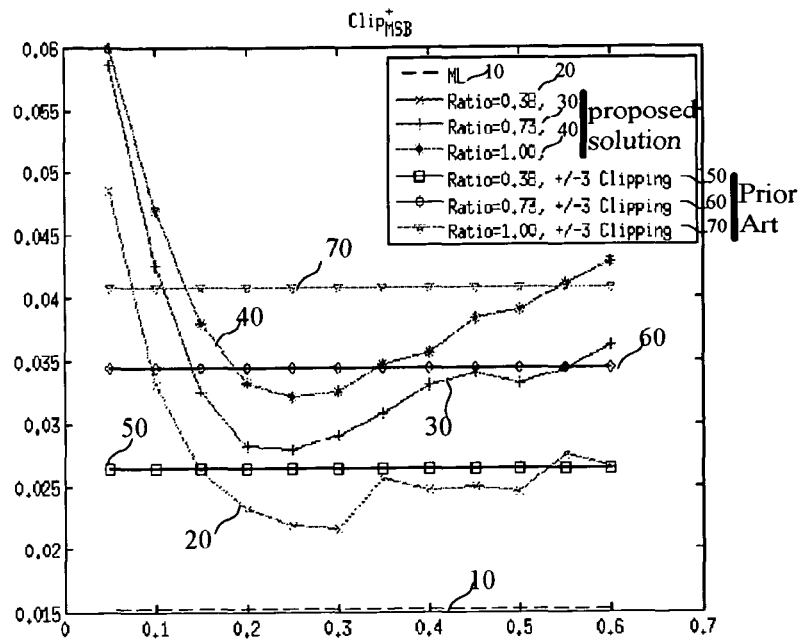
Figure 7D:
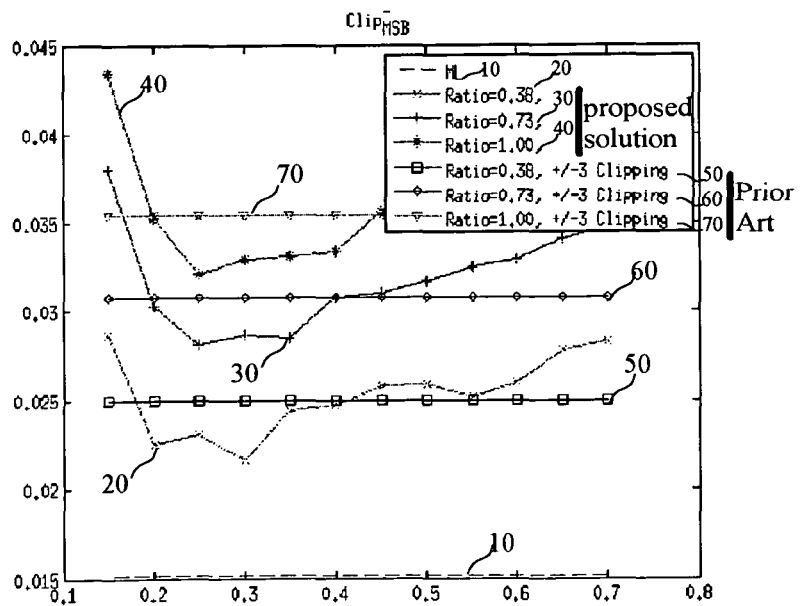

FIG. 7a illustrates the BER as a function of the tested $LSB^+$ clipping value with 38%, 73% and 100% of clipped values, respectively, with the ML and +/−3 clipping value references, for a given SNR of 10 dB FIG. 7b particularly illustrates the BER as a function of the tested $LSB^-$ clipping value with 38%, 73% and 100% of clipped values, respectively, with the ML and +/−3 clipping value references, for a given SNR of 10 dB FIG. 7c particularly illustrates the BER as a function of the tested $MSB^+$ clipping value with 38%, 73% and 100% of clipped values, respectively, with the ML and +/−3 clipping value references, for a given SNR of 10 dB FIG. 7d particularly illustrates the BER as a function of the tested $MSB^{31}$ clipping value with 38%, 73% and 100% of clipped values, respectively, with the ML and +/−3 clipping value references, for a given SNR of 10 dB One sees that the optimal clipping values for the positive LSB is the following: $LClip_{LSB}^+ = +0.20$.

This optimal value is constant over the SNR range and is independent of the number of clipped bits. This is not the case for the other bit position $LClip_{LSB}^-$, $LClip_{MSB}^-$, $LClip_{MSB}^+$ which depends on the SNR and on the number of clipped bits. Further note that the absolute clipping values for MSB are the same:

$$LClip_{MSB}^- = -LClip_{MSB}^+.$$

Figure 8:
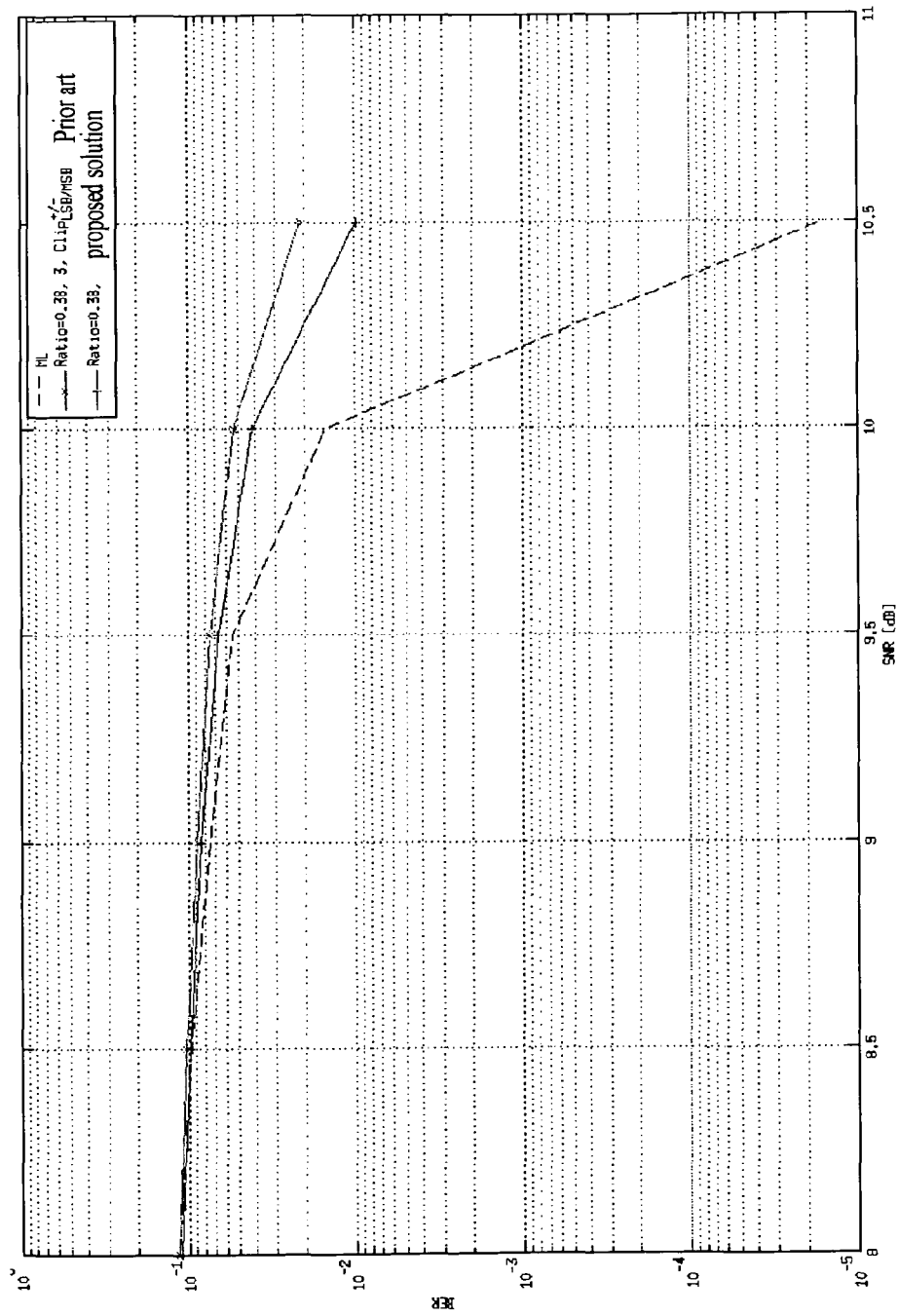
FIG. 8 illustrates the BER plots as a function of SNR, for 38% clipping values, respectively.

The BER performances confirm the efficiency in terms of performances of these optimal clipping values depending on the bit position and on the SNR as depicted in FIG. 8.

As shown in the FIG. 8, the proposed technique outperforms the clipping of +/−3 proposed in [2] by 0.22 dB.

The proposed technique allows for low distortion approximated LLR computation at the output of a soft-decision near-ML detector. Moreover, such approximation is judiciously applied depending on the actual bit-mapping indexing used by the QAM. To the best of our knowledge, any method presented so far exploits this information to solve the problem of LLR clipping for the class of receivers considered and such a technique offers significant performance gain.

The invention shows particularly suitable for any OFDM standard supporting MIMO spatial-multiplexing mode, e.g. IEEE 802.16, IEEE 802.11 and 3GPP LTE.

The invention claimed is:

1. A method for computing soft-decision Log-Likelihood-Ratios (LLRs) in a detector of a wireless communication receiver, said LLRs being used by a channel decoder, the method comprising:
    receiving a signal from a telecom front end, said signal corresponding to data belonging to a finite set of constellation symbols, each constellation symbol being arranged in a lattice constellation impaired by additive noise and also by a multiplicative channel;
    computing a limited list of distances representative of Euclidian distances between the received signal and a finite set of predetermined constellation symbols;
    deriving a set of soft decision LLRs from said limited list of distances under the constraint of a limited length of the list of distances; and
    completing said derived LLRs by clipping values read from a look-up table which is addressed by the values of the SNR and a bit index of a modulation constellation mapping of the constellation symbols, so as to complete the LLR computation for distances not included within said limited list of distances.

2. The method according to claim 1, further comprising:
    receiving a length of a limited list of distances for which an accurate LLR can be computed;
    wherein the limited list of distances is computed in accordance with the received limited list.

3. The method according to claim 1, wherein said look-up table is also addressed by a third value which is representative of an order of modulation.

4. The method according to claim 1, wherein said constellation is a Quadrature Amplitude Constellation, comprising one of 4QAM, 16QAM and 64QAM.

5. The method according to claim 1, wherein said channel decoder is one of a turbo decoder and a Viterbi decoder.

6. The method according to claim 1, wherein said receiver is an Orthogonal Frequency Division Multiplexing (OFDM) receiver.

7. The method according to claim 1, wherein said telecom front end is one of an Orthogonal Frequency Division Multiplexing (OFDM) and a Code Division Multiple Access (CDMA) communication system.

8. The method according to claim 1, wherein said telecom front end is a Code Division Multiple Access (CDMA) communication system.

9. A receiver for a wireless communication system comprising a detector for computing soft-decision LLRs to be forwarded to a channel decoder, said receiver comprising:
    a receiver configured to receive a signal from a telecom front end, said signal corresponding to data belonging to a finite set of constellation symbols, each constellation symbol being arranged in a lattice constellation impaired by additive noise and also by a multiplicative channel;
    a detector configured to compute a limited list of distances representative of Euclidian distances between the received signal and a finite set of predetermined constellation symbols;
    a computation node configured to derive a set of soft-decision LLRs from said limited list of distances under the constraint of a limited length of the list of distances; and
    a decoder configured to complete said derived LLRs by clipping values read from a look-up table which is addressed by the values of the SNR and a bit index of a modulation constellation mapping of the constellation symbols, so as to complete the LLR computation for distances not included within said limited list of distances.

10. The receiver according to claim 9, wherein the receiver is further configured to:
    receive a length of a limited list of distances for which an accurate LLR can be computed;
    wherein the limited list of distances is computed in accordance with the received limited list.

11. The receiver according to claim 9, wherein said look-up table is also addressed by a third value which is representative of an order of modulation.

12. The receiver according to claim 9, wherein said constellation is a Quadrature Amplitude Constellation, comprising one of 4QAM, 16QAM and 64QAM.

13. The receiver according to claim 9, wherein said channel decoder is one of a turbo decoder and a Viterbi decoder.

14. The receiver according to claim 9, wherein said receiver is an Orthogonal Frequency Division Multiplexing (OFDM) receiver.

15. A mobile telephone comprising a receiver for a wireless communication system comprising a detector for computing soft-decision LLRs to be forwarded to a channel decoder, said receiver comprising:
    a receiver for receiving a signal from a telecom front end, said signal corresponding to data belonging to a finite set of constellation symbols, each constellation symbol being arranged in a lattice constellation impaired by additive noise and also by a multiplicative channel;
    a detector for computing a limited list of distances representative of Euclidian distances between the received signal and a finite set of predetermined constellation symbols;
    a processor for deriving a set of soft-decision LLRs from said limited list of distances under the constraint of a limited length of the list of distances; and
    a decoder for completing said derived LLRs by clipping values read from a look-up table which is addressed by the values of the SNR and a bit index of a modulation constellation mapping of the constellation symbols, so as to complete the LLR computation for distances not included within said limited list of distances.

* * * * *